(12) United States Patent
Parkhurst et al.

(10) Patent No.: US 8,278,720 B2
(45) Date of Patent: Oct. 2, 2012

(54) FIELD EFFECT TRANSISTOR SWITCH FOR RF SIGNALS AND METHOD OF MAKING THE SAME

(75) Inventors: Ray Parkhurst, Santa Clara, CA (US); Shyh-Liang Fu, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 215 days.

(21) Appl. No.: 12/748,717

(22) Filed: Mar. 29, 2010

(65) Prior Publication Data

US 2011/0233628 A1 Sep. 29, 2011

(51) Int. Cl.
*H01L 27/11* (2006.01)
(52) U.S. Cl. . 257/379; 257/300; 257/350; 257/E27.016; 257/E21.7; 438/210; 438/238
(58) Field of Classification Search .................... 257/379
See application file for complete search history.

(56) References Cited

U.S. PATENT DOCUMENTS

| | | | |
|---|---|---|---|
| 5,313,083 A | 5/1994 | Schindler | |
| 7,034,362 B2 | 4/2006 | Rim | |
| 2006/0124962 A1 | 6/2006 | Ueda et al. | |
| 2006/0261912 A1 | 11/2006 | Miyagi et al. | |
| 2007/0146020 A1 | 6/2007 | Williams | |

OTHER PUBLICATIONS

L.W. Ke et al., "Monolothic Microwave ALGaAs/InGaAs Doped-Channel FET Switches", Microwave and Optical Technology Letters, vol. 3, No. 1, Sep. 1996, p. 47-49.

*Primary Examiner* — Michelle Mandala
*Assistant Examiner* — Shaka White

(57) ABSTRACT

A switching device has an input node, an output node, and a control node. The device includes: a substrate having a first side and a second side with a ground plane on the first side of the substrate and a mesa on the second side of the substrate. The mesa is made of a normally-conductive semiconductor material, and an isolation region substantially surrounds the mesa. A field effect transistor (FET) is on the mesa. The FET has an input terminal connected to the input node, an output terminal connected to the output node, and a gate. A capacitor is connected in series between the output terminal of the FET and the gate, and a resistor is connected in series between the control node and the gate. A gate electrode is directly connected to the gate. The gate electrode is disposed substantially entirely on the mesa.

20 Claims, 5 Drawing Sheets

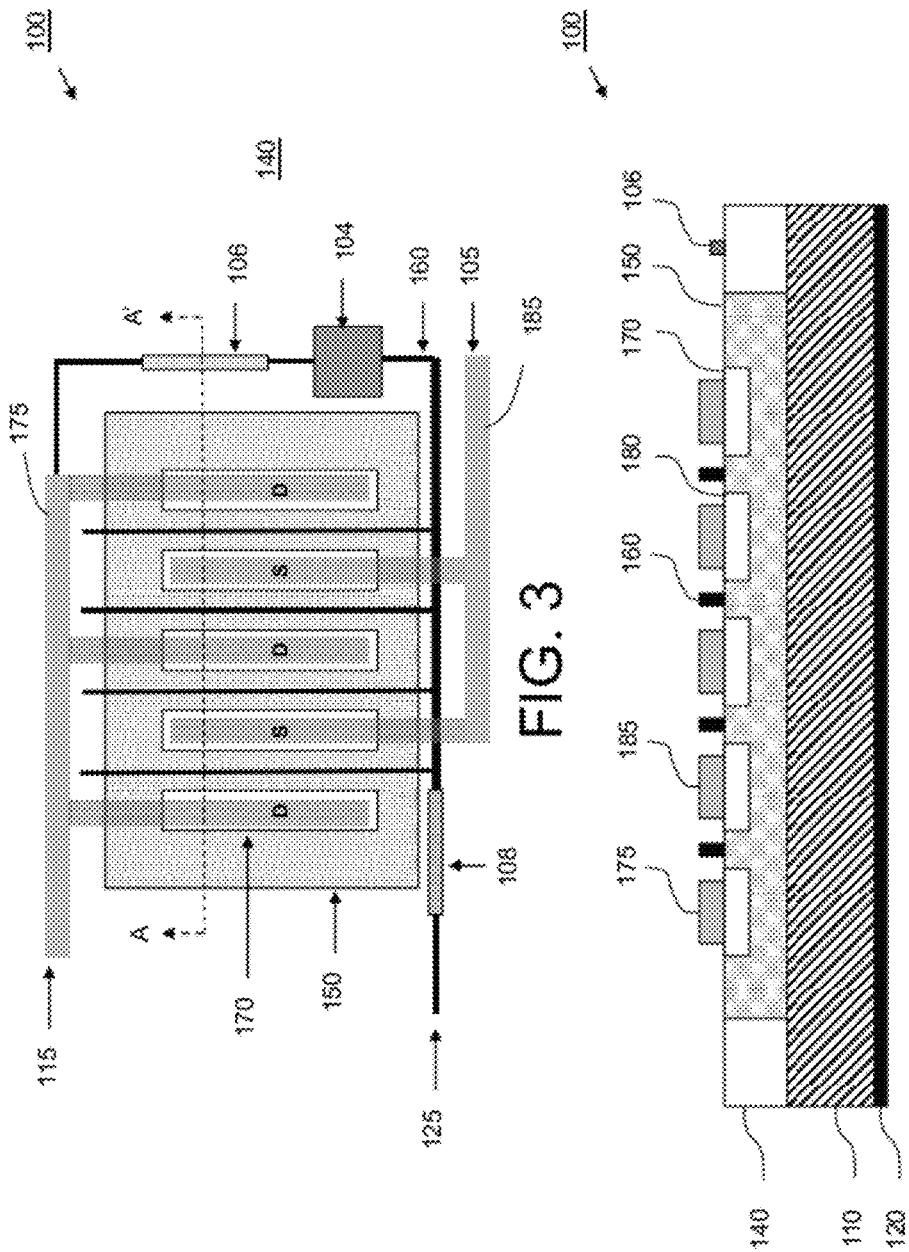

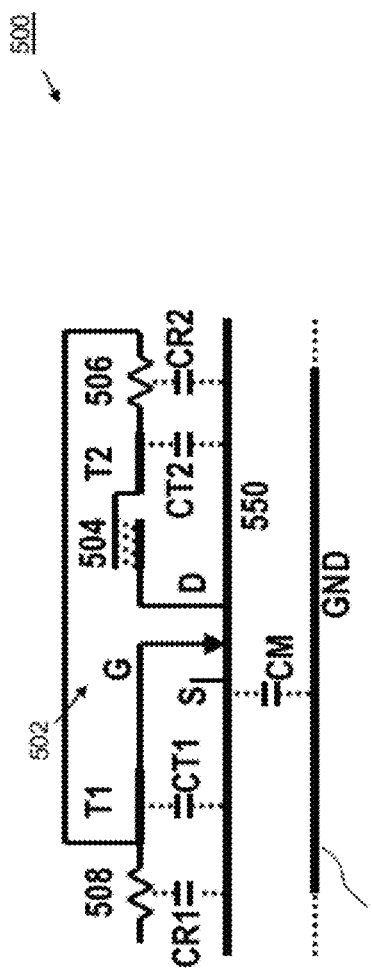
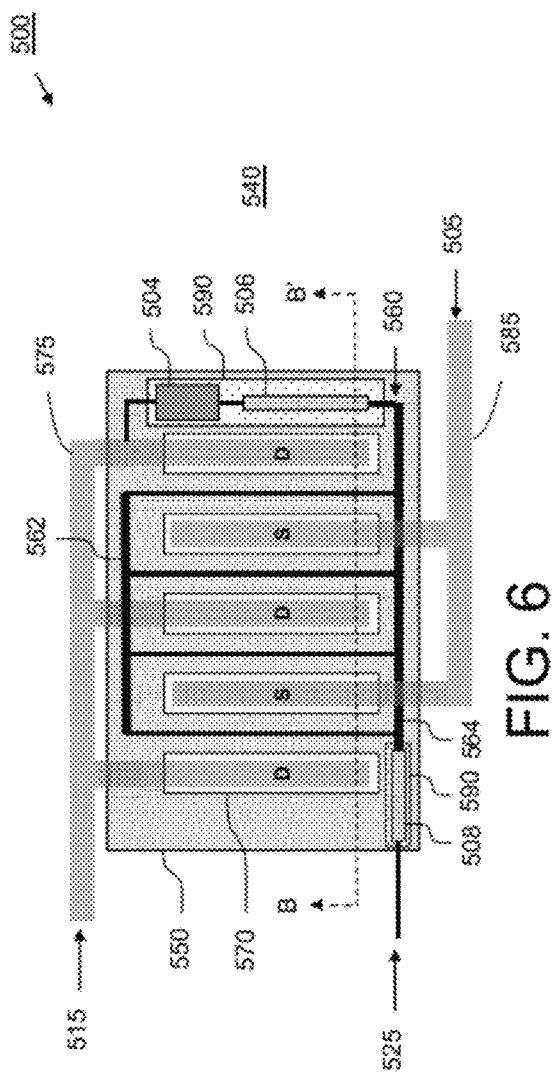
FIG. 5
FIG. 6

FIELD EFFECT TRANSISTOR SWITCH FOR RF SIGNALS AND METHOD OF MAKING THE SAME

BACKGROUND

Radio Frequency (RF) signals and components are employed in a variety of devices, including mobile communication devices such as mobile telephones. One type of commonly employed RF component is an RF switch, which is sometimes employed to selectively connect an RF signal from an input terminal to an output terminal. For example, an RF switch might be employed to selectively connect an antenna of a wireless mobile device (e.g., a mobile telephone) with either transmit or receive circuitry of the device. In another application, an RF switch may be employed for selectively connecting a signal path among a plurality of band-switching filters.

Some RF switches utilize a field effect transistor (FET) as the switching element. When operated as a switch, drain and source designations are typically not meaningful as the FET is operated in a symmetric fashion.

In general, there are a number of parasitic capacitances associated with a FET switch arising from the FET itself, and from various resistive and capacitive components employed in the switch, and from electrical traces connecting these components. These capacitances can degrade various aspect of the FET switch performance. In particular, parasitic gate capacitance to ground degrades the linearity of the FET switch and results in degraded harmonic and intermodulation performance for the FET switch.

In the past, a typical way to reduce these parasitic capacitances has been to make the wafer or substrate on which the FET is provided so as to decrease the parallel plate capacitances. However, this approach can only be taken so far before the interconnections to a mating board for the switch become excessively long, causing performance problems.

What is needed, therefore, is a FET switch for RF signals with an architecture that can produce reduced stray or parasitic capacitance values from the gate to ground.

SUMMARY

In an exemplary embodiment, a switching device has an input node, an output node, and a control node. The device comprises: a semiconductor substrate having a first side and a second side opposite the first side; a ground plane disposed on the first side of the semiconductor substrate; a mesa disposed on the second side of the semiconductor substrate, the mesa comprising normally-conductive semiconductor material; an isolation region substantially surrounding the mesa; a field effect transistor (FET) disposed on the mesa above the semiconductor substrate, the FET having an input terminal connected to the input node, an output terminal connected to the output node, and a gate; a first resistor in series with a capacitor, the series combination of the first resistor and the capacitor being disposed on the mesa and being connected between the output terminal of the FET and the gate of the FET; and a second resistor connected in series between the control node and the gate of the FET, the second resistor being disposed on the mesa.

In another exemplary embodiment, a method is provided for making a switching device having an input node, an output node, and a control node. The method comprises: on a semiconductor substrate having a ground plane on a first side thereof, providing a mesa on a second side of the semiconductor substrate opposite the first side, the mesa comprising normally-conductive semiconductor material; isolating the mesa with an isolation region; providing a field effect transistor (FET) on the mesa above the semiconductor substrate, the FET having an input terminal connected to the input node, an output terminal connected to the output node, and a gate; providing a capacitor connected between the output terminal of the FET and the gate of the FET; providing a resistor connected in series between the control node and the gate terminal of the FET; and providing a gate electrode directly connected to the gate of the FET, wherein the gate electrode is disposed substantially entirely on the mesa.

In yet another exemplary embodiment, a switching device has an input node, an output node, and a control node. The device includes: a substrate having a first side and a second side with a ground plane on the first side of the substrate and a mesa on the second side of the substrate. The mesa is made of a normally-conductive semiconductor material, and an isolation region substantially surrounds the mesa. A field effect transistor (FET) is on the mesa. The FET has an input terminal connected to the input node, an output terminal connected to the output node, and a gate. A capacitor is connected in series between the output terminal of the FET and the gate, and a resistor is connected in series between the control node and the gate. A gate electrode is directly connected to the gate. The gate electrode is disposed substantially entirely on the mesa.

BRIEF DESCRIPTION OF THE DRAWINGS

The exemplary embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3 shows a plan view of the FET switch device of FIG. 1.

FIG. 4 shows cross-sectional view of the field effect transistor (FET) switch device of FIG. 1.

FIG. 5 shows a hybrid/cross-sectional schematic representation of one embodiment of a FET switch device.

FIG. 6 shows a plan view of the FET switch device of FIG. 5.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, SHF, microwave, and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
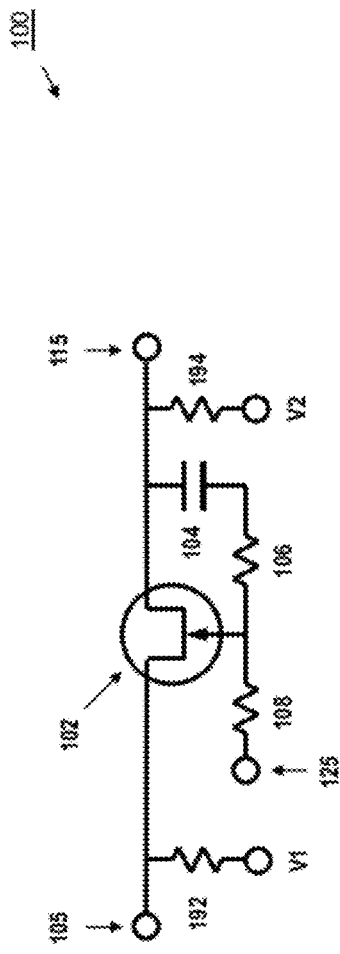
FIG. 1 shows a schematic diagram of field effect transistor (FET) switch device.

FIG. 1 shows a schematic diagram of field effect transistor (FET) switch device 100. Device 100 has an input node 105, and output node 115 and a control node. Device 100 includes a field effect transistor (FET) 102, a capacitor 104, a first resistor 106. In a beneficial arrangement device 100 further includes resistors 192 and 194.

In operation, an RF input signal is provided to input node 105 and thence to the input terminal (source or drain) of FET 102. A control signal is provided to control port 125 in response to which FET 102 is selectively turned on and off so as to selectively provide the RF input signal to the output terminal (drain or source) of FET 102 and thence to output port 115.

In device 100, capacitor 104 is provided to lower the operating cutoff frequency of the switch. First resistor 106 negates at least some of the feedback provided by capacitor 104 when FET 102 is turned off to increase the isolation between input port 105 and output port 115. In some embodiments, a network similar to the series combination of capacitor 104 and first resistor 106 may be provided for the source and drain connections to FET 102 to improve the symmetry of the switch and to reduce intermodulation and harmonic generation. Second resistor 108 limits the forward gate current into FET 102 when the switch is turned "on," and also provides a high AC impedance to limit the AC gate current as well.

Resistors 192 and 194 provide biasing for FET 102 and are generally high impedance. In one example embodiment, V1 and V2 may each be at ground, and the control signal applied to control node 125 may have a level of 5 volts to turn FET 102 "on" and may be at ground to turn FET 102 "off" Of course these are only example voltages for illustration purposes and other values may be employed in various embodiments.

Figure 2:
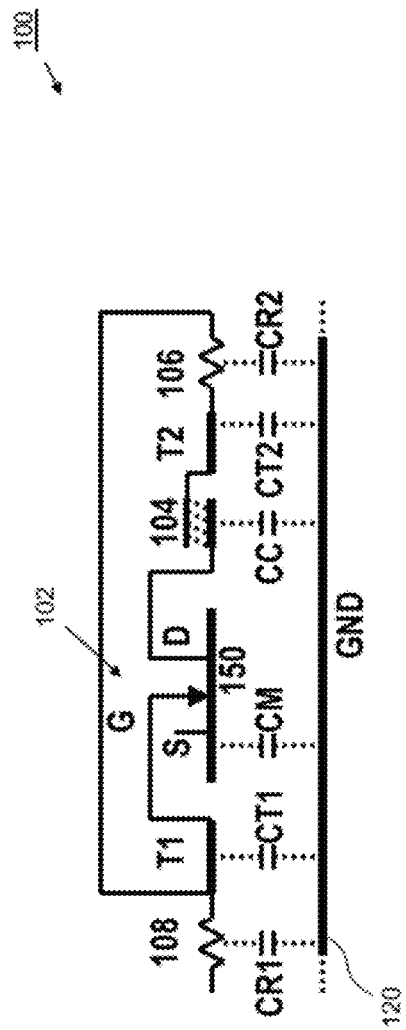
FIG. 2 shows a hybrid/cross-sectional schematic representation of the FET switch device of FIG. 1.

FIG. 2 shows a hybrid/cross-sectional schematic representation of the FET switch device 100 of FIG. 1. FIG. 2 illustrates how FET 102 is disposed on a Mesa 150 above a ground plane 120, while capacitor 104 first and second resistors 106 and 108 are disposed off of Mesa 150. FIG. 2 also illustrates conductive trace T1, connecting the gate of FET 102 to second resistor 108, and trace T2 connecting capacitor 104 and first resistor 106. FIG. 2 also illustrates various parasitic capacitance components which will be described in greater detail below.

FIG. 3 shows a plan view of the FET switch device 100 of FIG. 1, and FIG. 4 shows a cross-sectional view of FET switch device 100 along the line A-A' in FIG. 3.

FIGS. 3 and 4 show that device 100 is provided on a substrate 110 having a ground plane 120 disposed on a first side thereof. Substrate 110 also includes on a second side thereof a Mesa 150 surrounded or substantially surrounded by isolation region 140.

FET 102 includes a plurality of drain regions 170 (labeled "D" in FIG. 3) and source regions 180 (labeled "S" in FIG. 3). A drain electrode 175 is provided for the drain regions 170 and a source electrode 185 is provided for the source regions 180. An interdigitated gate electrode 160 is provided between corresponding pairs of source and drain regions.

Beneficially, substrate 110 is a semiconductor substrate, which may be a Gallium Arsenide (GaAs) substrate.

Beneficially, Mesa 150 comprises a normally-conductive semiconductor material.

Isolation region isolates the active device (FET 102) from other devices that may be produced on semiconductor substrate 110. In one embodiment as shown in FIG. 4, isolation region 140 comprises an inactive or dead material, such as an insulating material. In another embodiment, isolation region may be formed by removing part of a layer of material used for Mesa 150 from regions surrounding or substantially surrounding Mesa 150 such that Mesa 150 is elevated at a level above substrate 110 that is higher than the surrounding isolation region 140.

In some embodiments, various other layers such as contact layers, insulating layers, and cap layers may be provided which are not specifically shown in FIGS. 3 and 4 so as to not obscure relevant features being described herein.

As shown in FIGS. 3 and 4, FET 102 is fabricated on Mesa 150, while capacitor 104 first and second resistors 106 and 108 are disposed adjacent to Mesa 150 in isolation region 140.

As noted above, parasitic capacitances in device 100 can degrade the performance of the device. Parasitic capacitances include, for example, the capacitance CM between Mesa 150 and ground plane 120. Capacitor 104 is typically of metal-insulator-metal (MIM) construction, and is placed adjacent to Mesa 150 in isolation region 140. The bottom plate of capacitor 104 is usually connected to the drain or source potential, and the top plate to the gate potential. The resulting parasitic capacitance CC as shown in FIG. 2 is then part of the total drain or source capacitance, reducing its contribution to the total parasitic gate capacitance of FET 102.

In particular, parasitic capacitance from the gate of FET 102 to ground causes undesirable intermodulation and harmonic generation for the RF signal that is being controlled by the switch.

First resistor 106 is typically either of the "implant epitaxial" or "thin film" type and is located in isolation region 140 outside of Mesa 150. Parasitic capacitance CR2 to ground as shown in FIG. 2 due to the physical size of first resistor 106 adds to the total parasitic gate-to-ground capacitance of device 100 and has an undesirable effect as described above on the nonlinearities of device 100. High value thin film resistors may be used to minimize the resistor physical size and thus parasitic capacitance, but of course this technique has its own limitations.

Second resistor 108 is usually fabricated with a similar technology to first resistor 106, and has its own parasitic capacitance CR1 as shown in FIG. 2, again adding to the total parasitic gate-to-ground capacitance of device 100 and thus also augmenting the resulting nonlinearities of device 100.

The interconnecting conductive traces T2 between capacitor 104 and resistor 106, and T1 between the gate of FET 102 and second resistor 108, also have significant parasitic capacitances CT1 and CT2 shown in FIG. 2 which add to the total parasitic gate-to-ground capacitance. So these elements can also augment the resulting nonlinearities of device 100.

Furthermore, as best seen in FIG. 3, the layout of FET 102 includes extensions of the active gate fingers off Mesa 150 in order to guarantee that the gate exerts full pinch-off control over FET 102 and to provide a convenient, low capacitance, method of interconnecting the gate fingers. However, the extra parasitic capacitance to ground of these extensions and the interconnecting bus also adds to the total parasitic gate-to-ground capacitance and thus to the resulting nonlinearities of device 100.

So it is seen that FET switch device 100 includes various parasitic capacitances, particularly the parasitic gate-to-ground capacitance, that can degrade its performance. Therefore, it would be desirable to provide a FET switch device architecture that is capable of reducing these parasitic capacitances thereby improving the nonlinearities of the device.

FIG. 5 shows a hybrid/cross-sectional schematic representation of one embodiment of a FET switch device 500 that may address one or more of these shortcomings. Device 500 has an input node 505, and output node 515 and a control node. Device 500 includes a field effect transistor (FET) 502, a capacitor 504, a first resistor 506. In a beneficial arrangement FET switch device 500 further includes biasing resistors, such as resistors 192 and 194 illustrated in FIG. 1.

The schematic diagram for FET switch device 500 is the same as for FET switch device 100 illustrated in FIG. 1, with the reference numbers being correspondingly replaced (e.g., element 506 for element 106, etc.).

In operation, an RF input signal is provided to input node 505 and thence to the input terminal (source or drain) of FET 502. A control signal is provided to control port 525 in response to which FET 502 is selectively turned on and off so as to selectively provide the RF input signal to the output terminal (drain or source) of FET 502 and thence to output port 515.

In operation, an RF input signal is provided to input node 505 and thence to the input terminal (source or drain) of FET 502. A control signal is provided to control port 525 in response to which FET 502 is selectively turned on and off so as to selectively provide the RF input signal to the output terminal (drain or source) of FET 502 and thence to output port 515.

In device 500, capacitor 504 is provided to lower the operating cutoff frequency of the switch. First resistor 506 negates at least some of the feedback provided by capacitor 504 when FET 502 is turned off to increase the isolation between input port 505 and output port 515. In some embodiments, first resistor 506 may be omitted. In some embodiments, a network similar to the series combination of capacitor 504 and first resistor 506 may be provided for the source and drain connections to FET 502 to improve the symmetry of the switch and to reduce intermodulation and harmonic generation. Second resistor 508 limits the forward gate current into FET 502 when the switch is turned "on," and also provides a high AC impedance to limit the AC gate current as well.

Of significance, it is to be noted that FIG. 5 illustrates that FET 502, and the gate electrode for FET 502, are disposed on a Mesa 550 above a ground plane 520, together with capacitor 504 and first and second resistors 506 and 508. FIG. 5 also illustrates conductive (e.g., metal) trace T1, connecting the gate of FET 502 to second resistor 508, and conductive (e.g., metal) trace T2, connecting capacitor 504 and first resistor 506, also being provided on Mesa 550.

Figure 7:
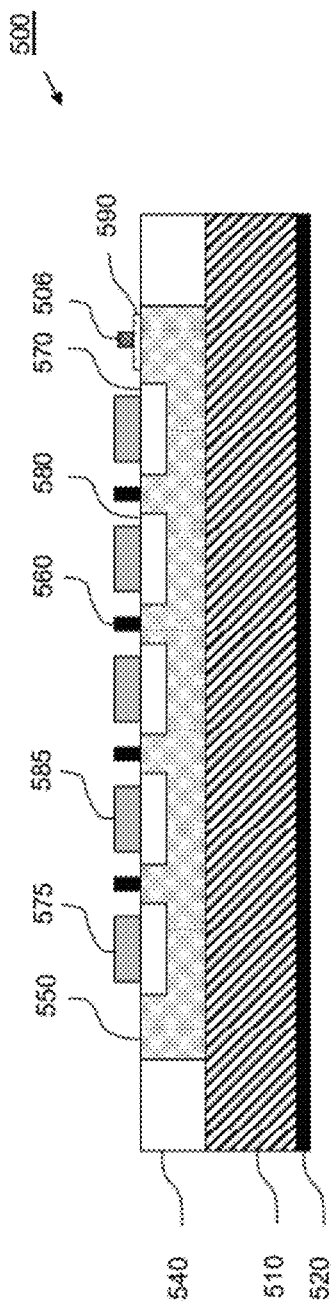
FIG. 7 shows cross-sectional view of the field effect transistor (FET) switch device of FIG. 5.

FIG. 6 shows a plan view of the FET switch device 500 of FIG. 5, and FIG. 7 shows cross-sectional view of FET switch device 500 along the line B-B' in FIG. 6.

FIGS. 6 and 7 show that device 500 is provided on a substrate 510 having a ground plane 520 disposed on a first side thereof. Substrate 510 also includes on a second side thereof one or more Mesas 550 each surrounded or substantially surrounded by isolation region 540.

FET 502 includes a plurality of drain regions 570 (labeled "D" in FIG. 6) and source regions 580 (labeled "S" in FIG. 6). A drain electrode 575 is provided for the drain regions 570 and a source electrode 585 is provided for the source regions 580. An interdigitated gate electrode 560 is provided between corresponding pairs of source and drain regions. The gate electrode 560 is here defined to comprise that contiguous conductive material which is connected directly to the gate of FET 502 without any intervening resistive or capacitive component. This, for example, the conductive trace T1 connecting the gate of FET 502 to resistor 508 is part of gate electrode 560, while the conductive trace T2 on the "other side" of resistor 506 (or the "other side" of capacitor 504 in embodiments where resistor 506 is omitted) from the gate of FET 502 is not part of gate electrode 560.

Beneficially, substrate 510 is a semiconductor substrate, which may be a Gallium Arsenide (GaAs) substrate.

Beneficially, Mesa 550 comprises a normally-conductive semiconductor material.

Isolation region 540 isolates the active device (FET 502) from other devices that may be produced on semiconductor substrate 510. In one embodiment as shown in FIG. 7, isolation region 540 comprises an inactive or dead material, such as an insulating material. In another embodiment, the isolation region may be formed by removing part of a layer of material used for Mesa 550 from regions surrounding or substantially surrounding Mesa 550 such that Mesa 550 is elevated at a level above substrate 510 that is higher than the surrounding isolation region 540.

In some embodiments, various other layers such as contact layers, insulating layers, and cap layers may be provided which are not specifically shown in FIGS. 6 and 7 so as to not obscure relevant features being described herein.

As shown in FIGS. 6 and 7, FET 502 is provided on Mesa 550 together with capacitor 504, and first and second resistors 506 and 508. Capacitor 504 may have a metal-insulator-metal (MIM) construction, and first and second resistors 506 and 508 may have a "thin film" type construction. As shown in FIGS. 6 and 7, capacitor 504 and resistors 506 and 508 are insulated from Mesa 550 by insulating layer 590. Also, the conductive (e.g., metal) layer for gate electrode 560 is disposed entirely or substantially (at least 95%) entirely on Mesa 550. Beneficially, in device 500 the drain-to-source paths on Mesa 550 are broken by the gate bridges 562 and 564 disposed on Mesa 550 which connect the interdigitated gate fingers of gate electrode 560 at each end.

As a result of these features, various parasitic capacitances present in device 500 are different from those in device 100. For example, the parasitic capacitances CT1 and CT2 of trace T1 between second resistor 508 and the gate of FET 502, and trace T2 between capacitor 504 and first resistor 506, are moved onto the Mesa 550. Similarly, the parasitic capacitances of first resistor 506 and second resistor 508 are moved onto the Mesa 550.

As a consequence of this architecture, the parasitic gate-to-ground capacitance of device 500 can be reduced, this diminishing non-linearities for the device, such as second harmonic and intermodulation distortion.

Although in a beneficial arrangement in device 500 capacitor 504 and first and second resistors 506 and 508 are all provided on Mesa 550, in some embodiments only one or more of these components may be provided on Mesa 550 with the remaining component(s) being disposed in isolation region 540. Furthermore, as mentioned above in some embodiments a network similar to the series combination of capacitor 504 and first resistor 506 may be provided for the source and drain connections to FET 502. In that case, in some embodiments these elements may also be provided on Mesa 550.

Figure 8:
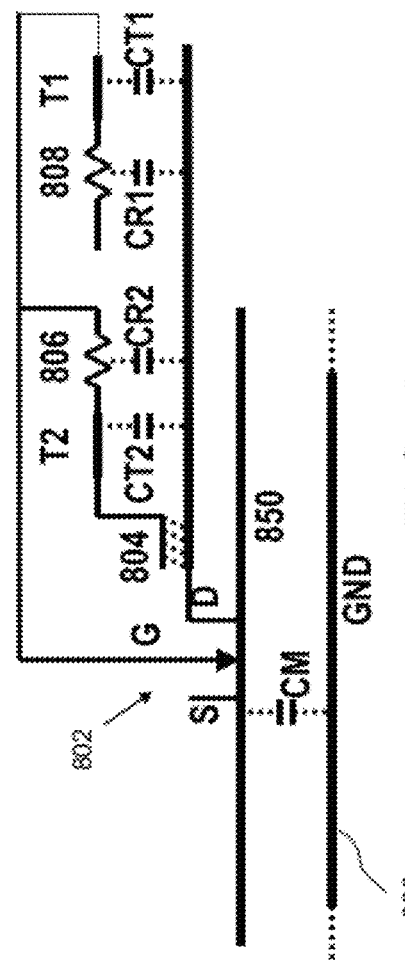
FIG. 8 shows a hybrid/cross-sectional schematic representation of another embodiment of a FET switch device.

FIG. 8 shows a hybrid/cross-sectional schematic representation of another embodiment of a FET switch device 800. Device 800 has an input node 808, and output node 815 and a control node. Device 800 includes a field effect transistor (FET) 802, a capacitor 804, a first resistor 806. In a beneficial arrangement device 800 further includes biasing resistors, such as resistors 192 and 194 illustrated in FIG. 1.

The schematic diagram for FET switch device 800 is the same as for FET switch device 100 illustrated in FIG. 1, with the reference numbers being correspondingly replaced (e.g., element 806 for element 106, etc.).

In operation, an RF input signal is provided to input node 805 and thence to the input terminal (source or drain) of FET 802. A control signal is provided to control port 825 in response to which FET 802 is selectively turned on and off so as to selectively provide the RF input signal to the output terminal (drain or source) of FET 802 and thence to output port 815.

In device 800, capacitor 804 is provided to lower the operating cutoff frequency of the switch. First resistor 806 negates at least some of the feedback provided by capacitor 804 when FET 802 is turned off to increase the isolation between input port 805 and output port 815. In some embodiments, first resistor 806 may be omitted. In some embodiments, a network similar to the series combination of capacitor 804 and first resistor 806 may be provided for the source and drain connections to FET 802 to improve the symmetry of the switch and to reduce intermodulation and harmonic generation. Second resistor 808 limits the forward gate current into FET 802 when the switch is turned "on," and also provides a high AC impedance to limit the AC gate current as well.

Of significance, it is to be noted that FIG. 8 illustrates how FET 802, and the gate electrode for FET 802, are disposed on a Mesa 850 above a ground plane 820, together with capacitor 804 and first and second resistors 806 and 808. FIG. 8 also illustrates conductive (e.g., metal) trace T1, connecting the gate of FET 802 to second resistor 808, and conductive (e.g., metal) trace T2 connecting capacitor 804 and first resistor 806, also being provided on a drain "finger" of Mesa 850.

Figures 9, 10:
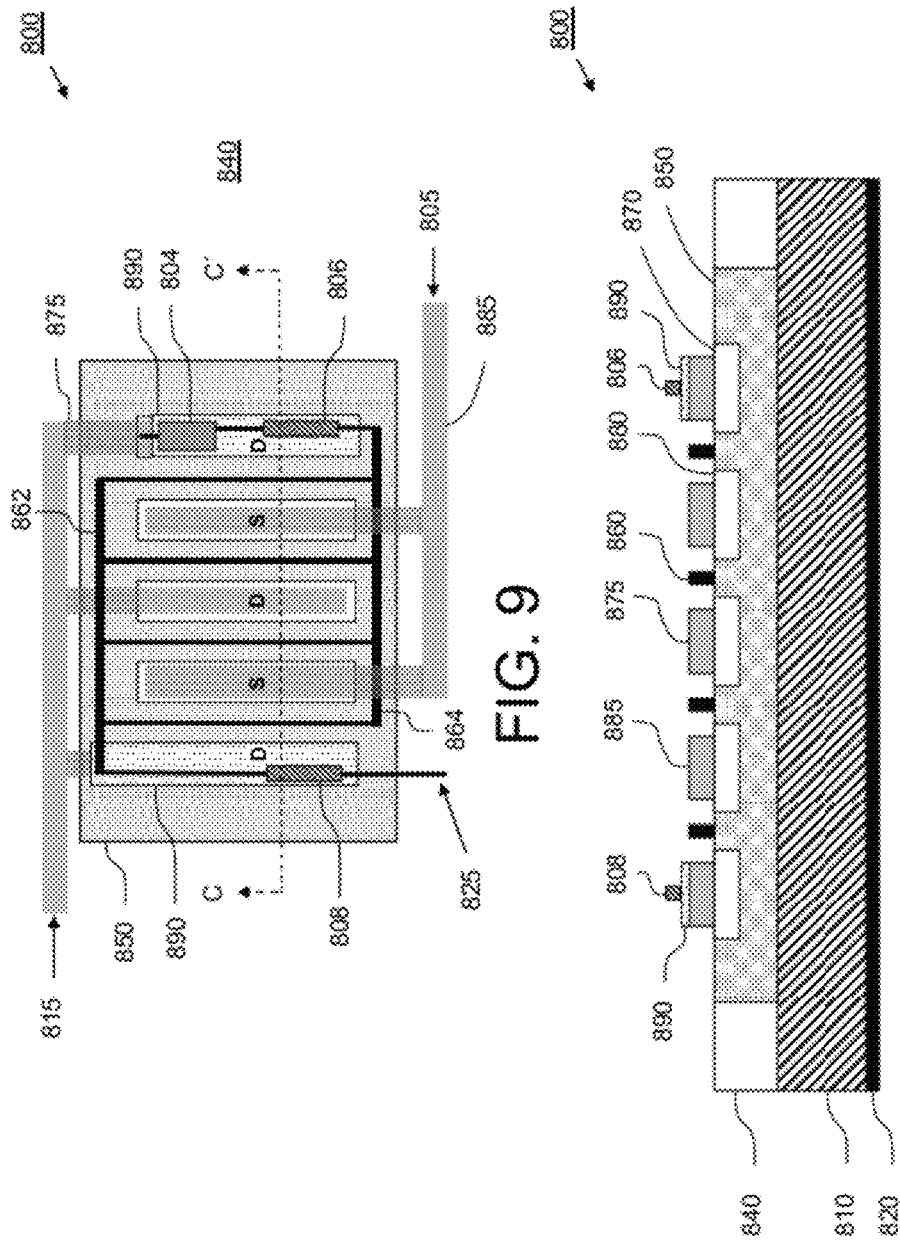
FIG. 9 shows a plan view of the FET switch device of FIG. 8.
FIG. 10 shows cross-sectional view of the field effect transistor (FET) switch device of FIG. 8.

FIG. 9 shows a plan view of the FET switch device 800 of FIG. 8, and FIG. 10 shows a cross-sectional view of FET switch device 800 along the line C-C' in FIG. 9.

FIGS. 9 and 10 show that device 800 is provided on a substrate 810 having a ground plane 820 disposed on a first side thereof. Substrate 810 also includes on a second side thereof one or more Mesas 850 each surrounded or substantially surrounded by isolation region 840.

FET 802 includes a plurality of drain regions 870 (labeled "D" in FIG. 9) and source regions 880 (labeled "S" in FIG. 9). A drain electrode 875 having a plurality of drain fingers is provided for drain regions 870 and a source electrode 885 having a plurality of source fingers is provided for source regions 880. An interdigitated gate electrode 860 is provided between corresponding pairs of source and drain regions. The gate electrode 860 is here defined to comprise that contiguous conductive material which is connected directly to the gate of FET 802 without any intervening resistive or capacitive component. Thus, for example, the conductive trace T1 connecting the gate of FET 802 to resistor 808 is part of gate electrode 860, while the conductive trace T2 on the "other side" of resistor 806 (or the "other side" of capacitor 804 in embodiments where resistor 806 is omitted) from the gate of FET 802 is not part of gate electrode 860.

Beneficially, substrate 810 is a semiconductor substrate, which may be a Gallium Arsenide (GaAs) substrate.

Beneficially, Mesa 850 comprises a normally-conductive semiconductor material.

Isolation region isolates the active device (FET 802) from other devices that may be produced on semiconductor substrate 810. In one embodiment as shown in FIG. 10, isolation region 840 comprises an inactive or dead material, such as an insulating material. In another embodiment, the isolation region may be formed by removing part of a layer of material used for Mesa 850 from regions surrounding or substantially surrounding Mesa 850 such that Mesa 850 is elevated at a level above substrate 810 that is higher than the surrounding isolation region 840.

In some embodiments, various other layers such as contact layers, insulating layers, and cap layers may be provided which are not specifically shown in FIGS. 9 and 10 so as to not obscure relevant features being described herein.

As shown in FIGS. 9 and 10, capacitor 804 and first and second resistors 806 and 808 are provided on drain electrode 875, being isolated from drain electrode 875 by an insulating layer 890. Capacitor 804 may have a metal-insulator-metal (MIM) construction, and first and second resistors 806 and 808 may have a "thin film" type construction. Also, the conductive (e.g., metal) layer for the gate electrode 860 is disposed entirely or substantially (i.e., at least 95%) entirely on Mesa 850. Beneficially, in device 800 the drain-to-source paths on Mesa 850 are broken by the gate bridges 862 and 864 disposed on Mesa 550 which connect the interdigitated gate fingers at each end.

As a result of these features, various parasitic capacitances present in device 800 are different from those in device 100. For example, the parasitic capacitances CT1 and CT2 of conductive trace T1 between second resistor 808 and the gate of FET 802, and conductive trace T2 between capacitor 804 and first resistor 806, are moved onto the drain electrode 875. Similarly, the parasitic capacitances of first resistor 806 and second resistor 808 are moved onto the drain electrode 875.

As a consequence of this architecture, the parasitic gate-to-ground capacitance of device 800 can be reduced, this diminishing non-linearities for the device, such as second harmonic and intermodulation distortion.

Although in the embodiment shown in FIGS. 8-10, capacitor 804 and first and second resistors 806 and 808 are all provided on a drain electrode 875, in other embodiments some or all of these components may be provided instead on a source electrode 885. Also, although in the embodiment shown in FIGS. 9-10, capacitor 804 and first and second resistors 806 and 808 are all provided on drain fingers of drain electrode 875 in the area above Mesa 850, in some embodiments one or more of these components could instead be provided on a portion of drain electrode 875 and/or source electrode 885 that is not located above Mesa 850.

Although in a beneficial arrangement in device 800 capacitor 804 and first and second resistors 806 and 808 are all provided on a source electrode 885 and/or drain electrode 875, in some embodiments only one or more of these components may be provided on a source electrode 885 and/or a drain electrode 875, with the remaining component(s) being disposed on Mesa 850 and/or in isolation region 840. Furthermore, as mentioned above in some embodiments a network similar to the series combination of capacitor 804 and first resistor 806 may be provided for the source and drain connections to FET 802. In that case, in some embodiments these components may also be provided on a source electrode 885 and/or drain electrode 875.

While exemplary embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A switching device having an input node, an output node, and a control node, the device comprising:
   a semiconductor substrate having a first side and a second side opposite the first side;
   a ground plane disposed on the first side of the semiconductor substrate;
   a mesa disposed on the second side of the semiconductor substrate, the mesa comprising normally-conductive semiconductor material;
   an isolation region substantially surrounding the mesa;
   a field effect transistor (FET) disposed on the mesa above the semiconductor substrate, the FET having an input terminal connected to the input node, an output terminal connected to the output node, and a gate;
   a first resistor in series with a capacitor, the series combination of the first resistor and the capacitor being disposed on the mesa and being connected between the output terminal of the FET and the gate of the FET; and
   a second resistor connected in series between the control node and the gate of the FET, the second resistor being disposed on the mesa.

2. The device of claim 1, further comprising a gate electrode directly between the gate of the FET and the series combination of the first resistor and capacitor, and also being directly connected between the gate of the FET and the second resistor, wherein the gate electrode is disposed entirely on the mesa.

3. The device of claim 1, wherein the isolation region comprises an insulating material.

4. The device of claim 1, wherein the isolation region comprises an inactive material disposed above the semiconductor substrate at substantially a same height as the mesa.

5. The device of claim 1, further comprising a source electrode connected to a first one of the input and output terminals of the FET, and a drain electrode connected to a second one of the input and output terminals of the FET, wherein at least one of the first resistor, the second resistor, and the capacitor is disposed on one of the source electrode and the drain electrode.

6. The device of claim 1, further comprising a source electrode connected to a first one of the input and output terminals of the FET, and a drain electrode connected to a second one of the input and output terminals of the FET, wherein the first resistor, the second resistor, and the capacitor are each disposed on one or both of the source electrode and the drain electrode.

7. The device of claim 1, wherein the FET further comprises:
   a plurality of source regions connected by a source electrode;
   a plurality of drain regions connected by a drain electrode; and
   an conductive layer for an interdigitated gate electrode extending along paths between pairs of the source and drain electrodes, the conductive layer being disposed entirely on the mesa.

8. A method of making a switching device having an input node, an output node, and a control node, the method comprising:
   on a semiconductor substrate having a ground plane on a first side thereof, providing a mesa on a second side of the semiconductor substrate opposite the first side, the mesa comprising normally-conductive semiconductor material;
   isolating the mesa with an isolation region;
   providing a field effect transistor (FET) on the mesa above the semiconductor substrate, the FET having an input terminal connected to the input node, an output terminal connected to the output node, and a gate;
   providing a capacitor connected between the output terminal of the FET and the gate of the FET;
   providing a resistor connected in series between the control node and the gate terminal of the FET; and
   providing a gate electrode directly connected to the gate of the FET, wherein the gate electrode is disposed substantially entirely on the mesa.

9. The method of claim 8, wherein isolating the mesa comprises removing a material layer for forming the mesa from a region surrounding the mesa.

10. The method of claim 8, wherein isolating the mesa comprises providing an insulating material on the second surface of the substrate substantially surrounding the mesa.

11. The method of claim 8, wherein at least one of the capacitor and the resistor is disposed on the mesa.

12. The method of claim 8, wherein both the capacitor and the resistor are disposed on the mesa.

13. The method of claim 8, further comprising:
   providing a source electrode connected to a first one of the input and output terminals of the FET, and a drain electrode connected to a second one of the input and output terminals of the FET; and
   providing at least one of the resistor and the capacitor on one of the source electrode and the drain electrode.

14. The method of claim 12, further comprising:
   providing a source electrode connected to a first one of the input and output terminals of the FET, and a drain electrode connected to a second one of the input and output terminals of the FET; and
   providing the first resistor and the capacitor on one or both of the source electrode and the drain electrode.

15. A switching device having an input node, an output node, and a control node, the device comprising:
   a substrate having a first side and a second side opposite the first side;
   a ground plane on the first side of the substrate;
   a mesa on the second side of the substrate, the mesa comprising normally-conductive semiconductor material;
   an isolation region substantially surrounding the mesa;
   a field effect transistor (FET) on the mesa above the substrate, the FET having an input terminal connected to the input node, an output terminal connected to the output node, and a gate;
   a capacitor connected in series between the output terminal of the FET and the gate of the FET;
   a resistor connected in series between the control node and the gate of the FET; and
   a gate electrode directly connected to the gate of the FET, wherein the gate electrode is disposed substantially entirely on the mesa.

16. The device of claim 15, wherein the isolation region comprises an insulating material.

17. The device of claim 15, wherein the isolation region comprises an inactive material disposed above the substrate at substantially a same height as the mesa.

18. The device of claim 15, wherein at least one of the capacitor and the resistor are provided on the mesa.

19. The device of claim 15, further comprising a source electrode connected to a first one of the input and output terminals of the FET, and a drain electrode connected to a second one of the input and output terminals of the FET, wherein at least one of the resistor and the capacitor is disposed on one of the source electrode and the drain electrode.

20. The device of claim 15, further comprising a source electrode connected to a first one of the input and output terminals of the FET, and a drain electrode connected to a second one of the input and output terminals of the FET, wherein the resistor and the capacitor are disposed on one or both of the source electrode and the drain electrode.

* * * * *